(12) United States Patent
Li et al.

(10) Patent No.: US 8,754,710 B2
(45) Date of Patent: Jun. 17, 2014

(54) LOW-NOISE AMPLIFIERS FOR RF RECEIVER

(75) Inventors: Qiang Li, Irvine, CA (US); Si-Ning Zhou, Irvine, CA (US); Chih-Ming Hung, Mckinney, TX (US)

(73) Assignee: MStar Semiconductor, Inc., Hsinchu (TW)

(*) Notice: Subject to any disclaimer, the term of this patent is extended or adjusted under 35 U.S.C. 154(b) by 76 days.

(21) Appl. No.: 13/530,251

(22) Filed: Jun. 22, 2012

(65) Prior Publication Data

US 2013/0344838 A1    Dec. 26, 2013

(51) Int. Cl.
*H03F 3/68*    (2006.01)

(52) U.S. Cl.
USPC .................. 330/295; 330/124 R; 455/311

(58) Field of Classification Search
USPC .................... 330/295, 124 R, 53, 54, 286, 84
See application file for complete search history.

(56) References Cited

U.S. PATENT DOCUMENTS

| 7,414,478 B2* | 8/2008 | Elmala et al. | 330/295 |
| 7,800,448 B2* | 9/2010 | Blednov | 330/295 |

* cited by examiner

*Primary Examiner* — Hieu Nguyen
(74) *Attorney, Agent, or Firm* — WPAT, PC; Justin King

(57) ABSTRACT

Disclosed are low-noise amplifiers and SAW-less receivers. An exemplary amplifier includes at least two amplifier modules. The amplifier modules share a common output node and comprise a common input to which the amplifier modules are AC or DC coupled for receiving an inbound RF signal. The amplifier modules operate at different biases.

13 Claims, 3 Drawing Sheets

LOW-NOISE AMPLIFIERS FOR RF RECEIVER

FIELD OF THE INVENTION

The present disclosure relates generally to the design and implementation of radio frequency (RF) receivers, and more specifically to the design and implementation of low-noise amplifiers (LNAs).

BACKGROUND OF THE INVENTION

LNAs in RF receivers are used to boost the inbound signal level prior to the frequency conversion process, which is important in preventing mixer noise from dominating the overall front-end noise performance. A typical RF receiver is required to process a weak target signal with large interferers. A single large interferer saturates a LNA in a RF receiver, resulting in a minute gain of the target signal. This is called blocking and this single large interferer is called a blocker. Moreover, these interferers generate unsolicited inter-modulation components in the signal channel due to the non-linear characteristic of the LNA, and the inter-modulation components are then processed by the RF receiver with the target signal. These are examples of desensitization in that the receiver sensitivity (ability to process very weak signals) is compromised.

To ease signal desensitization aroused by inter-modulation components and a blocker, a surface acoustic wave (SAW) filter, a type of bandpass filter, is commonly adopted in a RF receiver to prevent the interferers from reaching LNA. The SAW filter is, however, an off-chip component which cannot be integrated, and fabrication cost may thus increase sharply. Therefore, to reduce the fabrication cost, a RF receiver without a SAW filter is a popular issue.

SUMMARY OF THE INVENTION

An exemplary amplifier includes at least two amplifier modules. The amplifier modules coupled together to share a common output node and include a common input to which the amplifier modules are alternative-current (AC) or direct-current (DC) coupled for receiving an inbound RF signal. The amplifier modules operate at different biases.

An exemplary amplifier includes at least two amplifier modules. The amplifier modules have a common input to receive an inbound RF signal, and output a current to a common output node. The amplifier modules are AC or DC coupled to the common input. One of the transconductance amplifiers allows a wider voltage range of the inbound RF signal than another amplifier module AC coupled to the common input node.

An exemplary SAW-less receiver includes an antenna, a low-noise amplifier, and a mixer. The low-noise amplifier has a common input to which the amplifier modules are AC coupled for receiving an inbound RF signal from the antenna. The amplifier modules output amplified RF signals at a common output node, and operate at different biases. The mixer down converts a summation of the amplified RF signals.

BRIEF DESCRIPTION OF THE DRAWINGS

The invention can be more fully understood by the subsequent detailed description and examples with references made to the accompanying drawings, wherein.

DETAILED DESCRIPTION OF PREFERRED EMBODIMENTS

The present invention will be described herein in the context of exemplary low-noise amplifiers in receivers. Although illustrative embodiments of the present invention may be particularly well-suited for a SAW-less RF receiver or transceiver, illustrative embodiments of the present invention may be used in a variety of contexts, including a broad range of communications, radar, and radiometry applications.

It is therefore to be understood that the techniques of the present invention are not limited to the methods and apparatuses shown and described herein. Rather, alternative methods and apparatuses within the scope of the invention will become apparent to those skilled in the art given the teaching therein.

Figure 1:
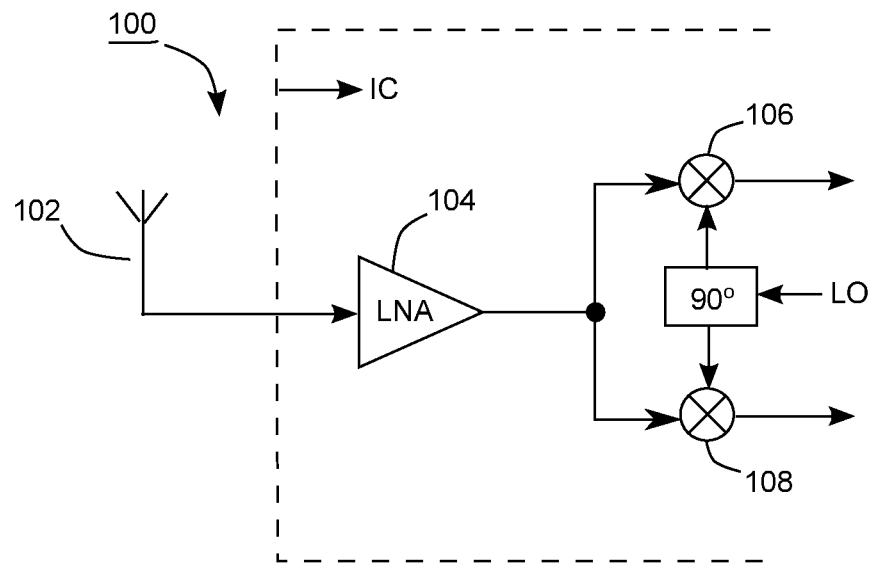
FIG. 1 is a block diagram of an exemplary homodyne wireless receiver suitable for an illustrative embodiment of the present invention.

FIG. 1 is a block diagram of an exemplary homodyne wireless receiver suitable for an illustrative embodiment of the present invention. RF receiver 100 includes an antenna 102, a low-noise amplifier (LNA) 104, and a pair of down-conversion mixers 106 and 108. Down-conversion mixers 106 and 108 receive local oscillation signal LO with a 90-degree rotation therebetween, for down-converting amplified RF signals outputted from the low-noise amplifier 104. It can be seen from the above that RF receiver 100 is a SAW-less receiver since no SAW filter is included on the signal path from the antenna 102 to the LNA 104. In another embodiment, RF receiver 100 further includes a SAW filter to provide bandpass filtering prior to the LNA 104. The LNA 104 and the down-conversion mixers 106 and 108 may be implemented in an integrated circuit chip. If the LNA 104 is a differential amplifier, a balun can be further included to convert the unbalanced inbound RF signals from the antenna 102 into balanced inbound RF signals, which are then fed to differential inputs of the LNA 104. Convention aspects of RF receiver 100 and other receivers and/or transceivers suitable for an illustrative embodiment of the present invention are well-known to those skilled in the art.

Figure 2:
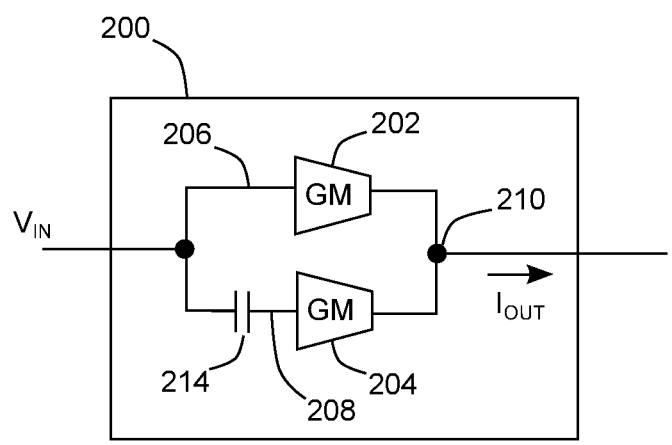
FIG. 2 shows a block diagram of an exemplary LNA, according to an illustrative embodiment of the invention.

FIG. 2 shows a block diagram of an exemplary LNA 200, according to an illustrative embodiment of the invention. The LNA 200 includes two transconductance amplifiers 202 and 204 coupled in parallel, each converting voltage $V_{IN}$ of inbound RF signal into current for output. The transconductance amplifiers 202 and 204 can also be regarded as amplifier modules. A capacitor 214 provides alternative-currents (AC) coupling between the transconductance amplifiers 202 and 204. Accordingly, the transconductance amplifier 202 is direct-current (DC) coupled to a common input 206, which is AC coupled to the input 208 of transconductance amplifier 204. As the transconductance amplifiers 202 and 204 share a common output node 210, the outputted currents from transconductance amplifiers 202 and 204 are summed up to an amplified output current $I_{OUT}$.

The transconductance amplifiers 202 and 204 in FIG. 2 of an embodiment of the present invention are preferred to be different in some aspects. In this embodiment, the transconductance amplifier 202 is a Class A amplifier while the transconductance amplifier 204 is a Class B amplifier. A Class A amplifier performs well in amplifier linearity and noise figure (NF) for small signals, but is prone to suffer from gain compression while confronting a blocker. Especially with a SAW-less implementation, the gain is usually not large enough to amplify the target signal to the required level due to the blocker saturating the LNA. A Class B amplifier, on the contrary, is less tempted to a gain compression because of wider headroom for the voltage of inbound signal, but suffers from bad amplifier linearity and NF for small signal. In other words, a Class A amplifier prevails when a blocker is small, while a Class B amplifier is preferred when a blocker is large. In other aspects, it can also be interpreted as a Class A amplifier prevails when the target signal is larger, while a Class B amplifier is preferred when the target signal is smaller. Coupling the transconductance amplifiers 202 and 204 in parallel as illustrated in FIG. 2 enables different types of transconductance amplifiers to dominate for different inbound signals, allowing the LNA 200 to be operable under different power levels of a blocker.

Figure 3:
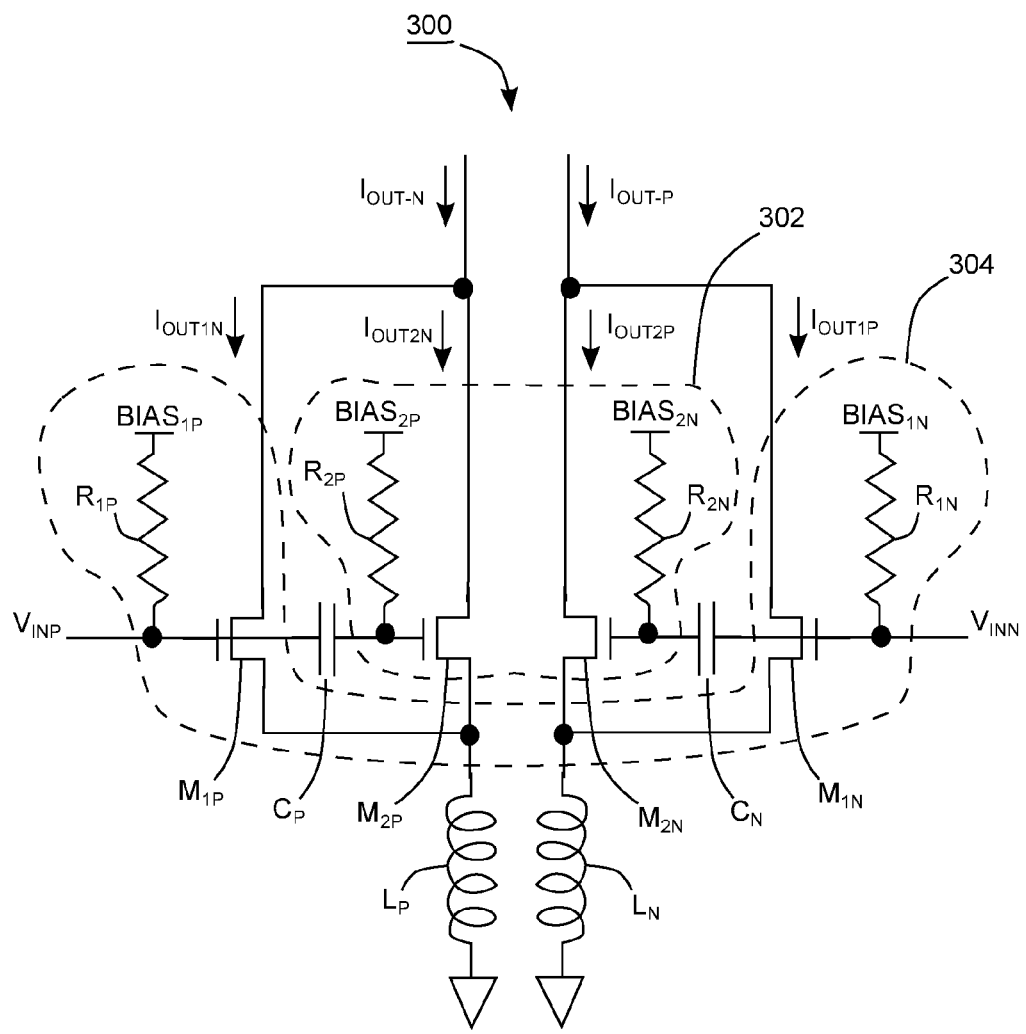
FIG. 3 shows a schematic diagram of an exemplary differential LNA, according to an illustrative embodiment of the invention.

FIG. 3 shows a schematic diagram of an exemplary differential LNA 300, according to an illustrative embodiment of the invention. A differential LNA 300 has two differential transconductance amplifiers 302 and 304 of the same configuration. Taking the differential transconductance amplifier 302 as an illustrative example, it includes a pair of common-source amplifiers. In the differential transconductance amplifier 302, the sources of NMOSs $M_{2P}$ and $M_{2N}$ are coupled to a ground voltage via inductors $L_P$ and $L_N$, respectively. The gates of the NMOSs $M_{2P}$ and $M_{2N}$ act as non-inverted and inverted inputs of the differential transconductance amplifier 302, and are alternative-current (AC) coupled via capacitors $C_P$ and $C_N$ to receive differential inputs $V_{INP}$ and $V_{INN}$. Bias voltages $BIAS_{2P}$ and $BIAS_{2N}$ provide the bias conditions for NMOSs $M_{2P}$ and $M_{2N}$, substantially determining Class of the differential transconductance amplifier 302. A slight difference between the bias voltages $BIAS_{2P}$ and $BIAS_{2N}$ may exist to reduce a second order intermodulation (IM2). The NMOSs $M_{2P}$ and $M_{2N}$ convert differential input voltages $V_{INP}$ and $V_{INN}$ to differential currents $I_{OUT2N}$ and $I_{OUT2P}$, respectively outputted from the drains of the NMOSs $M_{2P}$ and $M_{2N}$. Operations of the transconductance amplifier 304 can be deduced according to the teaching of the transconductance amplifier 302. Please note that the gate of NMOS $M_{1P}$ is AC coupled to the gate of NMOS $M_{2P}$, such that the NMOSs $M_{1P}$ and $M_{2P}$ operate at different biases. Currents $I_{OUT2N}$ and current $_{OUT1N}$, respectively outputted from the transconductance amplifiers 302 and 304, are summed up to become an output current $I_{OUT-N}$. Similarly, the currents $I_{OUT2P}$ and $I_{OUT-P}$ are summed up to become an output current $I_{OUT-P}$. The output currents $I_{OUT-P}$ and $I_{OUT-N}$ form the differential output currents of the differential LNA 300. In other words, the output currents $I_{OUT1N}$, $I_{OUT2N}$, $I_{OUT1P}$, and $I_{OUT2P}$, each can be regarded as an amplified RF signal, form the differential output currents of the differential LNA 300, which can be regarded as a summation of amplified RF signals to be down-converted by mixers in a wireless receiver.

In one embodiment, the transconductance amplifier 304 is biased to be a Class A amplifier while the transconductance amplifier 302 is biased to be a Class B or AB amplifier. For example, bias voltages $BIAS_{2P}$ and $BIAS_{2N}$ are designed to be equaled to, or higher than the threshold voltages of the NMOSs M11 and M12, making the transconductance amplifier 302 a Class B or AB amplifier. It is common that due to the integrated circuit fabrication, NMOSs 11n, 12n, 21n, and N22 share substantially the same threshold voltage, $V_{NTH}$.

The transconductance amplifier 304 could function as a Class A amplifier if bias voltages $BIAS_{1P}$ and $BIAS_{1N}$ are at approximately the middle between the threshold voltage $V_{NTH}$ and the maximum voltage, $v_{NTOP}$, which is the saturation voltage of a NMOS; that is, if the maximum voltage $V_{NTOP}$ is applied to the gate of the NMOS, it renders the NMOS saturated. As a result, the headroom for the voltage of input signal of the transconductance amplifier 302 is approximately the difference between $V_{NTOP}$ and $V_{NTH}$, and is approximately twice of the headroom for the input signal of the transconductance amplifier 304. If a blocker is introduced in the differential input signal (input voltages $V_{INP}$ and $v_{INN}$), it is possible that the transconductance amplifier 304 suffers from a gain compression while transconductance amplifier 302 doesn't, because the transconductance amplifier 302 has wider headroom for the voltage of input voltage.

Figure 4:
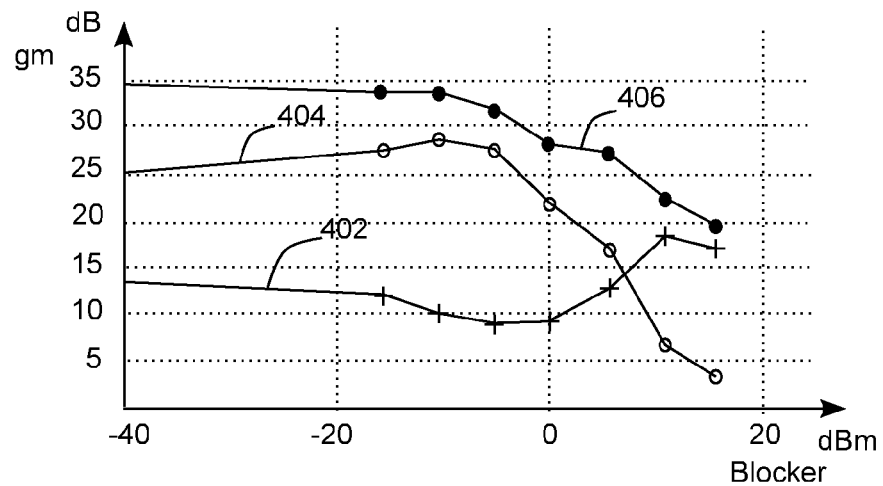
FIG. 4 shows simulation results related to a differential LNA.

The simulation results related to the differential LNA 300 are plotted in FIG. 4. Curves 402, 404, and 406 correspond to the gain results (transconductances) of the transconductance amplifier 302, the transconductance amplifier 304, and the differential LNA 300, respectively. The power of an introduced blocker ranges from −40 dBm to 20 dBm. When the introduced blocker is weak, transconductance amplifier 304 dominates the gain of the differential LNA 300. When the blocker is strong, the gain of the transconductance amplifier 304 reduces sharply because of a gain compression, but the transconductance amplifier 302, which has wider headroom, might take over to considerably contribute its gain to the differential LNA 300. Therefore, for a blocker with power stronger than −5 dBm, the gain of the differential LNA 300 does not decrease as significantly as the gain of the transconductance amplifier 304 does. The transconductance amplifiers 302 and 304 could be optimized, based on their gains and biases, to form the differential LNA 300 capable of providing enough gain when a larger blocker appears, and particularly suitable for a SAW-less receiver.

Figure 5:
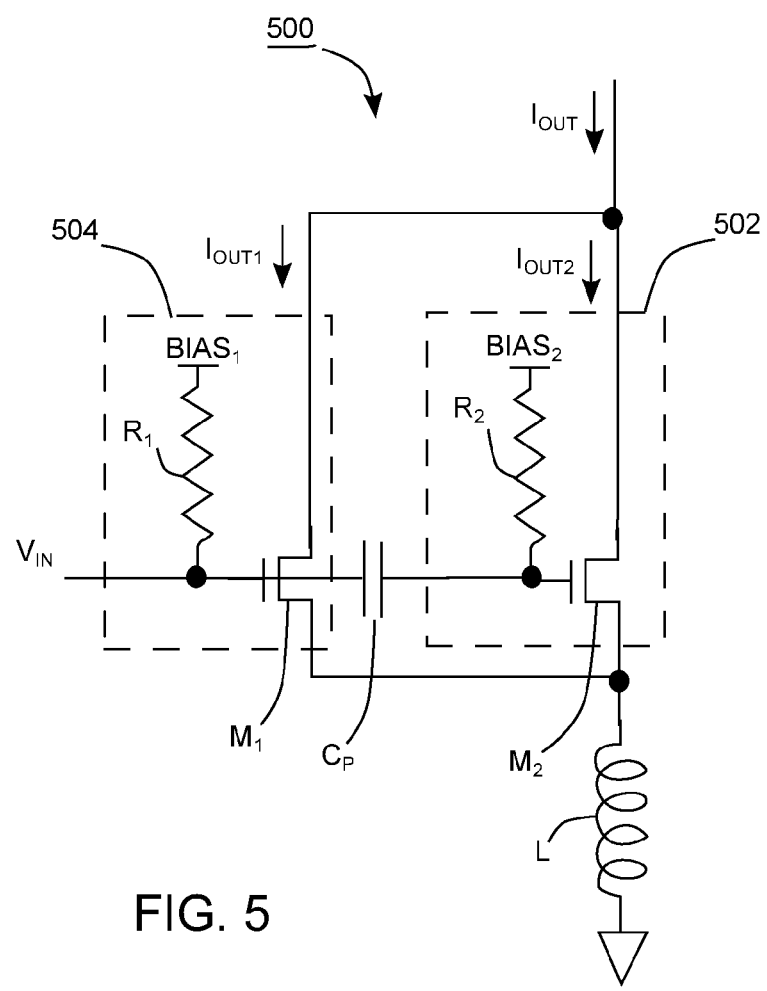
FIG. 5 shows a schematic diagram of an exemplary LNA, according to an illustrative embodiment of the invention.

FIG. 5 shows a schematic diagram of an exemplary LNA 500, according to an illustrative embodiment of the invention. Different from the differential LNA 300 in FIG. 3, which has a pair of inputs and a pair of outputs, the LNA 500 in FIG. 5 has only a single-ended input and a single-ended output. Two transconductance amplifiers 502 and 504 are coupled in parallel, sharing a common output node and AC coupled to a common input for receiving an inbound RF signal, $V_{IN}$. The transconductance amplifiers 502 and 504 have the same amplifier configuration; that is, they both are common-source amplifiers. The operations of the LNA 500 can be deduced by those skilled in the art based on the teaching of FIG. 3, since the LNA 500 in FIG. 5 substantially duplicates the left half of the differential LNA 300 in FIG. 3.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A low noise amplifier, comprising:
a plurality of amplifier modules, coupled to share a common output node and comprising a common input to which the amplifier modules are alternative-current (AC) or direct-current (DC) coupled for receiving an inbound RF signal;
wherein the amplifier modules operate at different biases; and
wherein the amplifier modules comprise a Class A amplifier in combination with a Class B or a Class AB amplifier.

2. The amplifier of claim 1, further comprising a capacitor that couples one of the amplifier modules to the common input, such that the amplifier module that couples to the capacitor is capable to receive the inbound RF signal when voltage of the inbound RF signal is within a predetermined range.

3. The amplifier of claim 1, wherein the plurality of amplifier modules are transconductance amplifiers.

4. The amplifier of claim 1, wherein the plurality of amplifier modules have differential circuit structure.

5. The amplifier of claim 1, wherein the plurality of amplifier modules are common-source amplifiers.

6. A low noise amplifier, comprising:
a plurality of amplifier modules, comprising a common input to receive an inbound RF signal, and outputting a current to a common output node;
wherein the amplifier modules are AC or DC coupled to the common input, and one of the amplifier modules allows a wider voltage range of the inbound RF signal than another amplifier module AC coupled to the common input node;
wherein the amplifier modules comprise a Class A amplifier in combination with a Class B or a Class AB amplifier.

7. The amplifier of claim 6, further comprising a capacitor that couples one of the amplifier modules to the common input, such that the amplifier module that couples to the capacitor is capable to receive the inbound RF signal when voltage of the inbound RF signal is within a predetermined range.

8. The amplifier of claim 6, wherein the plurality of amplifier modules have differential circuit structure.

9. The amplifier of claim 6, wherein the plurality of amplifier modules are common-source amplifiers.

10. A saw-less receiver, comprising:
an antenna;
a low-noise amplifier, comprising:
a plurality of amplifier modules, comprising a common input to which the amplifier modules are AC or DC coupled for receiving an inbound RF signal from the antenna, and outputting amplified RF signals at a common output node, wherein the plurality of amplifier modules operate at different biases;
a mixer, for down converting a summation of the amplified RF signals; and
wherein the amplifier modules comprise a Class A amplifier in combination with a Class B or a Class AB amplifier.

11. The saw-less receiver of claim 10, wherein the low-noise amplifier comprises a capacitor that couples one of the amplifier modules to the common input, such that the amplifier module that couples to the capacitor is capable to receive the inbound RF signal when voltage of the inbound RF signal is within a predetermined range.

12. The saw-less receiver of claim 10, wherein the plurality of amplifier modules have differential circuit structure.

13. The saw-less receiver of claim 10, wherein the plurality of amplifier modules are common-source amplifiers.

\* \* \* \* \*